United States Patent
St. Romain, II et al.

(10) Patent No.: US 11,727,169 B2
(45) Date of Patent: Aug. 15, 2023

(54) SYSTEMS AND METHODS FOR INFERRING SIMULATED DATA

(71) Applicant: Toyota Research Institute, Inc., Los Altos, CA (US)

(72) Inventors: Randall J. St. Romain, II, Ann Arbor, MI (US); Hiroyuki Funaya, Ann Arbor, MI (US); Michael James Delp, Ann Arbor, MI (US)

(73) Assignee: Toyota Research Institute, Inc., Los Altos, CA (US)

( * ) Notice: Subject to any disclaimer, the term of this patent is extended or adjusted under 35 U.S.C. 154(b) by 797 days.

(21) Appl. No.: 16/567,297

(22) Filed: Sep. 11, 2019

(65) Prior Publication Data

US 2021/0073345 A1 Mar. 11, 2021

(51) Int. Cl.
*G06F 30/20* (2020.01)
*G06N 3/08* (2023.01)
*G06N 3/04* (2023.01)
*G05D 1/00* (2006.01)
*G05D 1/02* (2020.01)

(52) U.S. Cl.
CPC ............... *G06F 30/20* (2020.01); *G06N 3/04* (2013.01); *G06N 3/08* (2013.01); *G05D 1/0088* (2013.01); *G05D 1/0231* (2013.01); *G05D 2201/0213* (2013.01)

(58) Field of Classification Search
CPC ...... G06F 30/20; G06F 30/27; G06F 11/3664; G06F 11/3684; G06N 3/04; G06N 3/08; G06N 3/0445; G06N 3/0454; G05D 1/0088; G05D 1/0231; G05D 2201/0213
See application file for complete search history.

(56) References Cited

U.S. PATENT DOCUMENTS

| | | | |
|---|---|---|---|
| 7,043,057 | B2 | 5/2006 | Retterath et al. |
| 9,786,084 | B1 | 10/2017 | Bhat et al. |
| 9,796,400 | B2 | 10/2017 | Puttagunta et al. |
| 2010/0094790 | A1 | 4/2010 | Gnojewski |
| 2011/0060478 | A1 | 3/2011 | Nickolaou |
| 2014/0122409 | A1 | 5/2014 | Na et al. |

(Continued)

OTHER PUBLICATIONS

Lee et al., "Spigan: Privileged Adversarial Learning from Stimulation," arXiv:1810.03756v3 [cs.CV],] Feb. 18, 2019, pp. 1-14.

(Continued)

*Primary Examiner* — Steven W Crabb
(74) *Attorney, Agent, or Firm* — Christopher G. Darrow; Darrow Mustafa PC

(57) ABSTRACT

System, methods, and other embodiments described herein relate to simulating sensor data. In one embodiment, a method includes, in response to receiving a request to generate simulated information corresponding to the sensor data, acquiring the sensor data that includes at least range information about a perceived environment. The simulated information includes one or more attributes of the sensor data that are absent from the sensor data in a current format. The method includes computing simulated information of the sensor data using a machine learning model that accepts the sensor data and labels as an input and produces the simulated information as an output. The labels identify at least objects in the perceived environment that are depicted by the sensor data. The method includes providing the simulated information with the sensor data.

20 Claims, 6 Drawing Sheets

(56) References Cited

U.S. PATENT DOCUMENTS

| | | | |
|---|---|---|---|
| 2016/0014395 A1 | 1/2016 | Murray et al. | |
| 2016/0178802 A1 | 6/2016 | Olshansky et al. | |
| 2017/0345140 A1 | 11/2017 | Zhang et al. | |
| 2017/0351952 A1 | 12/2017 | Zhang et al. | |
| 2018/0188733 A1 | 7/2018 | Iandola et al. | |
| 2018/0194286 A1 | 7/2018 | Stein | |
| 2018/0275658 A1 | 9/2018 | Iandola et al. | |
| 2019/0122441 A1 | 4/2019 | Agrawal et al. | |
| 2019/0179979 A1* | 6/2019 | Melick | G01P 21/02 |
| 2020/0074233 A1* | 3/2020 | Englard | G01S 7/4808 |
| 2020/0160598 A1* | 5/2020 | Manivasagam | G07C 5/02 |
| 2022/0043449 A1* | 2/2022 | Iandola | G05D 1/024 |

OTHER PUBLICATIONS

Zhu et al., "Unpaired Image-to-Image Translation using Cycle-Consistent Adversarial Networks," arXiv:1703.10593v6 [cs.CV,] Nov. 15, 2018, pp. 1-18.

Zhang et al., "StackGAN++: Realistic Image Synthesis with Stacked Generative Adversarial Networks," arXiv:1710.10916v2 [cs.CV,] Dec. 25, 2017, pp. 1-14.

Jing et al., "Neural Style Transfer: A Review," arXiv:1705.04058v1 [cs.CV,] May 11, 2017, pp. 1-14.

Peng et al., "Synthetic to Real Adaptation with Generative Correlation Alignment Networks," arXiv:1701.05524v3 [cs.CV,] Mar. 18, 2017, pp. 1-10.

Gaidon et al., "Virtual Worlds as Proxy for Multi-Object Tracking Analysis," arXiv:1605.06457v1 [cs.CV,] May 20, 2016, pp. 1-10.

Luan et al., "Deep Photo Style Transfer," arXiv:1703.07511v3 [cs.CV,] Apr. 11, 2017, pp. 1-9.

Goodfellow et al., "Generative Adversarial Nets," arXiv:1406.2661v1 [stat.ML,] Jun. 10, 2014, pp. 1-9, Montreal, QC H3C 3J7.

Shrivastava et al., "Learning from Simulated and Unsupervised Images through Adversarial Training," arXiv:1612.07828v2 [cs.CV,] Jul. 19, 2017, pp. 1-16, Pub. Apple Inc.

Isola et al., "Image-to-Image Translation with Conditional Adversarial Networks," arXiv:1611.07004v2 [cs.CV,] Nov. 22, 2017, pp. 1-17.

* cited by examiner

SYSTEMS AND METHODS FOR INFERRING SIMULATED DATA

TECHNICAL FIELD

The subject matter described herein relates, in general, to systems and methods for generating simulated sensor data, and, in particular, to inferring intensity data for light detection and ranging (LiDAR) sensor data.

BACKGROUND

Machine perception and understanding of electronic information is a complex task. For example, machines (e.g., robots) generally use electronic sensors such as cameras, LiDAR, and other sensors to acquire information about a surrounding environment. The information can take different forms such as still images, video, point clouds, and so on. Understanding the contents of the information generally involves complex processing that can encounter many difficulties. In one approach, a machine learning algorithm may be employed to perform a particular perception task such as detecting objects within provided image data. While machine learning algorithms can be effective at such tasks, the accuracy generally depends on the quantity, diversity, and quality of training examples that the machine learning algorithm uses to learn the task.

However, acquiring this breadth and quantity of training data can represent a significant hurdle to training the algorithm. For example, collecting actual sensor data generally involves driving a vehicle over many miles and through many different environments to collect raw data, which may then be manually labeled for training. Manually collecting and labeling sensor data is inefficient and often includes inaccuracies from errors associated with the manual labeling process. Moreover, the acquired sensor data may be incomplete or from different types of sensors. That is, camera images may have a limited color range (e.g., grayscale), LiDAR sensors may have lower fidelity or capture information with limited characteristics (e.g., only range data). Thus, available sensor data may not include a comprehensive assessment of the environment for a particular sensor type.

As a result of this discrepancy in the sensor data, there may be a gap within the understanding of the machine learning model when the sensor data is used as a training source. Accordingly, difficulties with accurately training machine learning models persist.

SUMMARY

In one embodiment, example systems and methods relate to a manner of simulating sensor data. Thus, in one or more aspects, a disclosed approach includes a machine learning model to support generating simulated sensor data or at least a portion of the sensor data that is, for example, otherwise unavailable from an actual sensor. For example, in one embodiment, the present approach includes a system that implements the machine learning model. The system may implement the machine learning model to have a particular architecture that, for example, accepts partial sensor data (e.g., data limited to range information) and infers additional attributes that correspond with the sensor data thereby simulating aspects of the sensor data.

In various approaches, the system implements the architecture to include different pre and/or post-processing transformations in relation to an artificial neural network (ANN) such as a convolutional neural network (CNN) or other deep learning architecture. As such, the system, in one aspect, acquires sensor data including, for example, range information and semantic labels as an input into the machine learning model. The system uses the machine learning model to compute simulated sensor data that corresponds with the input data. Accordingly, the system leverages learned correlations embodied within the machine learning model to infer the simulated sensor data, which can be, for example, LiDAR intensity data for points within a point cloud of range information. Thus, the system can supplement real sensor data that is missing one or more attributes because, for example, an originating sensor does not acquire the information or the information is otherwise lost. In this way, the system supports generating improved comprehensive sensor data for simulation through inference, and thereby improve the efficiency of generating the information to enhance the simulation.

In one embodiment, a simulation system for simulating sensor data is disclosed. The simulation system includes one or more processors and a memory communicably coupled to the one or more processors. The memory stores an input module including instructions that when executed by the one or more processors cause the one or more processors to, in response to receiving a request to generate simulated information associated with the sensor data, acquire the sensor data that includes at least range information about a perceived environment. The simulated information includes one or more attributes of the sensor data that are absent from the sensor data in a current format. The memory also includes a simulation module including instructions that when executed by the one or more processors cause the one or more processors to compute simulated information of the sensor data using a machine learning model that accepts the sensor data and labels as an input and produces the simulated information as an output. The labels identify at least objects in the perceived environment that are depicted by the sensor data. The simulation module further includes instructions to provide the simulated information with the sensor data.

In one embodiment, a non-transitory computer-readable medium for simulating sensor data and including instructions that when executed by one or more processors cause the one or more processors to perform one or more functions is disclosed. The instructions include instructions to, in response to receiving a request to generate simulated information associated with the sensor data, acquire the sensor data that includes at least range information about a perceived environment, wherein the simulated information includes one or more attributes of the sensor data that are absent from the sensor data in a current format. The instructions include instructions to compute simulated information of the sensor data using a machine learning model that accepts the sensor data and labels as an input and produces the simulated information as an output. The labels identify at least objects in the perceived environment that are depicted by the sensor data. The instructions include instructions to provide the simulated information with the sensor data.

In one embodiment, a method for simulating sensor data is disclosed. In one embodiment, a method includes, in response to receiving a request to generate simulated information corresponding to the sensor data, acquiring the sensor data that includes at least range information about a perceived environment. The simulated information includes one or more attributes of the sensor data that are absent from the sensor data in a current format. The method includes computing simulated information of the sensor data using a machine learning model that accepts the sensor data and labels as an input and produces the simulated information as an output. The labels identify at least objects in the perceived environment that are depicted by the sensor data. The method includes providing the simulated information with the sensor data.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
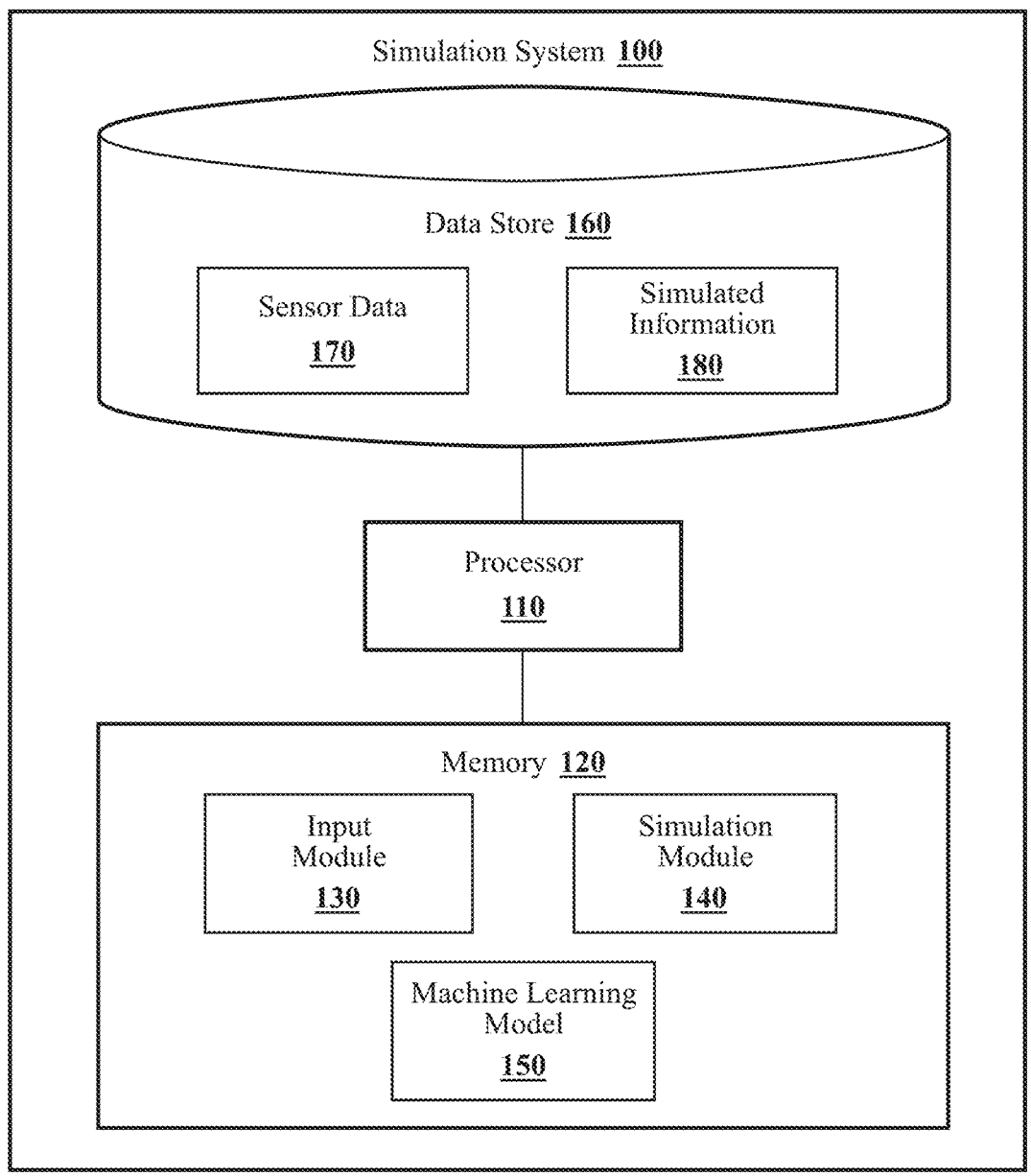
FIG. 1 illustrates one embodiment of a simulation system that is associated with using a machine learning model to simulate sensor data.

Systems, methods, and other embodiments associated with simulating sensor data are disclosed. As mentioned previously, quantity, quality, and diversity of training data controls how well a machine learning model is trained and, by extension, how well the model performs. For example, if a simulation is lacking in quality due to a lack of comprehensive sensor data, then a model may suffer from gaps in understanding that are realized as inaccurate determinations by the model (e.g., inaccurate classifications, etc.). In either case, shortcomings within a simulation from which training data is derived can carry over into the understanding of the machine learning models such that the models generally do not perform to the same standards as when trained with, for example, a comprehensive data set. Moreover, some techniques for simulating sensor data such as ray-tracing are computationally intensive and suffer from inaccuracies since each separate point is individually simulated through tracing geometric paths to a point of observation while also using heuristics in an attempt to estimate properties that can factor into values for the information.

Therefore, in one embodiment, a simulation system provides for inferring the missing attributes of sensor data in a streamlined process that leverages a machine learning model. For example, in one embodiment, a simulation system implements the machine learning model according to a particular architecture that, for example, accepts partial sensor data (e.g., data limited to range information) and infers additional attributes that correspond with the sensor data thereby simulating aspects of the sensor data.

To achieve this streamlined approach with the machine learning model, the simulation system initially trains the model over a set of training data. In one embodiment, the simulation system acquires the training data as real sensor data from one or more sensors that provide comprehensive observations. That is, the training data includes primary attributes (e.g., range information) and secondary attributes (e.g., intensity data), which a given sensor may or may not collect. Thus, for training purposes, the training sensor data is to be a complete representation of sensor perceptions including the primary and secondary attributes.

The simulation system trains the machine learning model using the training data by, in one approach, providing at least the primary attributes as input and comparing outputs in the form of simulated secondary attributes with the secondary attributes from the training sensor data. This comparison provides a loss or variance between the real values and the simulated values from which the simulation system can backpropagate values into the machine learning model. Moreover, in a further approach, the machine learning model also accepts labels for objects represented in the sensor data. That is, the labels may include semantic labels identifying each separate data point associated with a particular object. In a still further aspect, the labels can include additional classifications of the objects such as surface types, and so on. The simulation system may independently compute the labels and/or acquire the labels as a pre-defined characteristic of the sensor data. Thus, the simulation system may implement a separate machine learning model to compute the labels such as a convolutional neural network that performs semantic segmentation over the sensor data. In either case, the labels provide further insights into characteristics of the objects from which the system can infer the additional attributes.

Continuing with the discussion of the simulation of the sensor data, the simulation system, in one approach, implements an architecture of the simulating machine learning model to process the partial sensor data (e.g., LiDAR range data) along with, for example, semantic labels of the objects depicted in the sensor data. In one approach, the range data (i.e., primary attributes) is in the form of a point cloud, which is a set of data points in three-dimensional space indicating distance to surfaces of various objects in a perceived environment. As noted, the data points provide primary attributes including range data (i.e., distance) and, as applied in the present disclosure, generally do not indicate secondary attributes such as intensity.

Thus, the point cloud is a 3D representation of the perceived environment. As such, the simulation system, in one approach, includes mechanisms to handle the 3D data. In one embodiment, the simulation system includes pre and/or post-processing transformations in relation to an artificial neural network (ANN). The transformations may include processes to convert the 3D representation into voxels, into a two-dimensions format, feature transformations, aggregating functions that group point features via max pooling, activation functions (e.g., ReLU), and so on.

In either case, the simulation system, in one or more embodiments, implements the artificial neural network, at least in part, as a convolutional neural network (CNN) or another deep learning architecture. Consequently, in combination with the noted training approach, the system uses the machine learning model to compute simulated sensor data that corresponds with the input sensor data. That is, the system generates missing secondary attributes (e.g., intensity data) when receiving the range data and semantic labels as input. Accordingly, the system leverages learned correlations embodied within the machine learning model to infer the simulated sensor data, and thereby supplement incomplete LiDAR point cloud data with intensity data for points within the point cloud.

Therefore, the system can simulate a comprehensive perception of an environment when possessing only part of the real sensor data. In this way, the system supports generating improved comprehensive sensor data for simulation through inference, and thereby improves the efficiency of generating the information to enhance the simulation. Accordingly, the simulation system improves the generation of labeled training data such that comprehensive depictions of various scenes can be efficiently generated in lieu of using manual processes or incomplete data.

Referring to FIG. 1, one embodiment of a simulation system 100 that is implemented to perform methods and other functions as disclosed herein relating to generating aspects of sensor data by controlling a machine learning model is illustrated. As an initial matter, it should be appreciated, that while the simulation system 100 is illustrated as being a single contained system, in various embodiments, the simulation system 100 is a distributed system that is comprised of components that can be provided as a centralized server, a cloud-based service, and so on.

As an additional note, while the simulation system 100 is generally applicable to many different contexts within which machine learning models may be implemented, in one or more embodiments, the simulation system 100 is implemented to at least support functions of an advanced driving assistance system (ADAS) and/or an autonomous driving module that provides autonomous driving (i.e., self-driving) functionality to a vehicle. For example, an autonomous driving module, in one embodiment, is comprised of a plurality of sub-modules that each perform a respective task in relation to autonomously operating a vehicle. The sub-modules may, in combination or individually, determine travel path(s), current autonomous driving maneuvers for the vehicle, future autonomous driving maneuvers, modifications to current autonomous driving maneuvers, identification of obstacles/objects, and so on. Thus, to effectively function, the simulation system 100 initially trains the individual task-specific modules using training data from different scenarios that the vehicle may encounter.

However, as previously noted, acquiring comprehensive and accurate training data can represent a significant difficulty. Therefore, the simulation system 100 can be employed to generate a simulation from which training data can be derived by inferring missing attributes. Accordingly, the simulation system 100, in one embodiment, provides a simulation including the at least partially simulated sensor data as a mechanism to efficiently train modules on associated tasks.

With further reference to FIG. 1, the simulation system 100 is shown as including a processor 110. Accordingly, the processor 110 may represent a distributed processing resource, an individual local processor (e.g., a CPU, GPU, or application specific processor), or the simulation system 100 may access the processor 110 through a data bus or another communication path. In one embodiment, the simulation system 100 includes a memory 120 that stores an input module 130 and a simulation module 140. The memory 120 is a random-access memory (RAM), read-only memory (ROM), a hard-disk drive, a flash memory, a processor cache, or other suitable memory for storing the modules 130 and 140. The modules 130 and 140 are, for example, computer-readable instructions that when executed by the processor 110 cause the processor 110 to perform the various functions disclosed herein. The simulation system 100 is further illustrated as including a machine learning model 150. The machine learning model 150, as will be discussed in greater detail subsequently, may be a single deep learning network, a combination of pre/post processing functions along with a network, and/or a combination of multiple networks.

Moreover, as previously noted, in various embodiments, one or more aspects of the simulation system 100 are implemented as cloud-based services, or other remote networked services. Thus, one or more components of the simulation system 100 may be located remotely from other components and may be implemented in a distributed manner. As an additional matter, the simulation system 100 includes a data store 160 as a means of storing various data elements. The data store 160 is, in one embodiment, an electronic data structure stored in the memory 120 or a separate electronic storage. In one embodiment, the data store 160 is a database that is configured with routines that can be executed by the processor 110 for analyzing stored data, providing stored data, organizing stored data, and so on. Thus, in one embodiment, the data store 160 stores data used by the modules 130 and 140 in executing various functions. In the embodiment depicted in FIG. 1, the data store 160 includes sensor data 170, and simulated information 180, and/or other information such as may be used by the modules 130 and/or 140.

In general, the sensor data 170 includes, in one or more embodiments, range data. That is, the sensor data 170 includes three-dimensional point clouds of environments perceived by a LiDAR sensor that generally does not include intensity data (e.g., amplitude values for perceived returns) except for in the case of training data. Accordingly, in various approaches, the particular form of the sensor data 170 may vary and include images with depth data (e.g., stereo images, monocular images with a depth channel, etc.), pseudo-LiDAR from vision, radar data (active or passive), and so on. As such, the approaches discussed herein are not limited specifically to LiDAR range information but are generally applicable to range information about a perceived environment from which the simulation system 100 can simulate intensity data and thereby broadly simulate sensor data for an at least partially computer-generated simulation of an environment.

In further aspects, the sensor data 170 may also include labels of objects depicted within the sensor data 170. That is, the simulation system 100 acquires the sensor data 170 along with labels, which may be generated by the providing device as a preliminary processing step, or the simulation system 100 generates the labels as an additional pre-processing step. Thus, in one embodiment, the simulation system 100 includes an additional machine learning model that performs semantic segmentation or another object analysis/classification over the sensor data 170 to produce the labels. In either case, the labels identify, in one embodiment, classes of objects within the sensor data 170.

Furthermore, the simulated information 180 is generally discussed as intensity data, which may take different forms depending on the particular form of the sensor data 170 itself. That is, while the simulated information is a generally a secondary attribute (e.g., intensity) of the sensor data 170 as opposed to a primary attribute (e.g., range), the particular form can vary. In one embodiment, the simulated information 180 is the amplitude of a reflected light wave as originally emitted by a LiDAR (e.g., 10-20% of original amplitude). In further examples, the intensity is simply pixel brightness of a passively observed point within the environment. Thus, the simulation information 180 may vary according to which type of sensor the simulation system 100 is simulating.

Additionally, the machine learning model 150 may also be implemented in different forms. For example, as noted previously, the machine learning model 150 is an artificial neural network and may be implemented as, in one or more embodiments, a convolutional neural network (CNN), a recurrent neural network (RNN), a deep neural network (DNN), or another deep learning architecture that analyzes primary attributes of sensor data from a perceived scene and infers secondary attributes therefrom. Moreover, in one or more approaches, the model 150 includes one or more pre-processing transformations, and/or one or more post-processing transformations. For example, the transformations can include formatting conversions, filters, and/or other processes to prepare the sensor data 170 for processing by the neural network. In one embodiment, the transformations segment the sensor data 170 into pillars, layers, rows, or another form to separately process by the neural network. In a still further aspect, the transformations can include flattening 3D data into a 2D representation for processing via a 2D backbone, grouping points into voxels, and so on.

For example, one architecture of the model 150 includes a transformation to convert the 3D sensor data 170 into a sparse pseudo-image that is two-dimensional. The example architecture then implements a 2D convolutional neural network as a backbone along with a detection neural network (e.g., fully connected ANN) that converts the processed information back to 3D representation. In one approach, the detection network is a single-shot-detector (SSD). Moreover, in a further aspect, the model 150 may also include a CNN for performing semantic segmentation as a pre-processing transformation to the sensor data 170.

Figure 2:
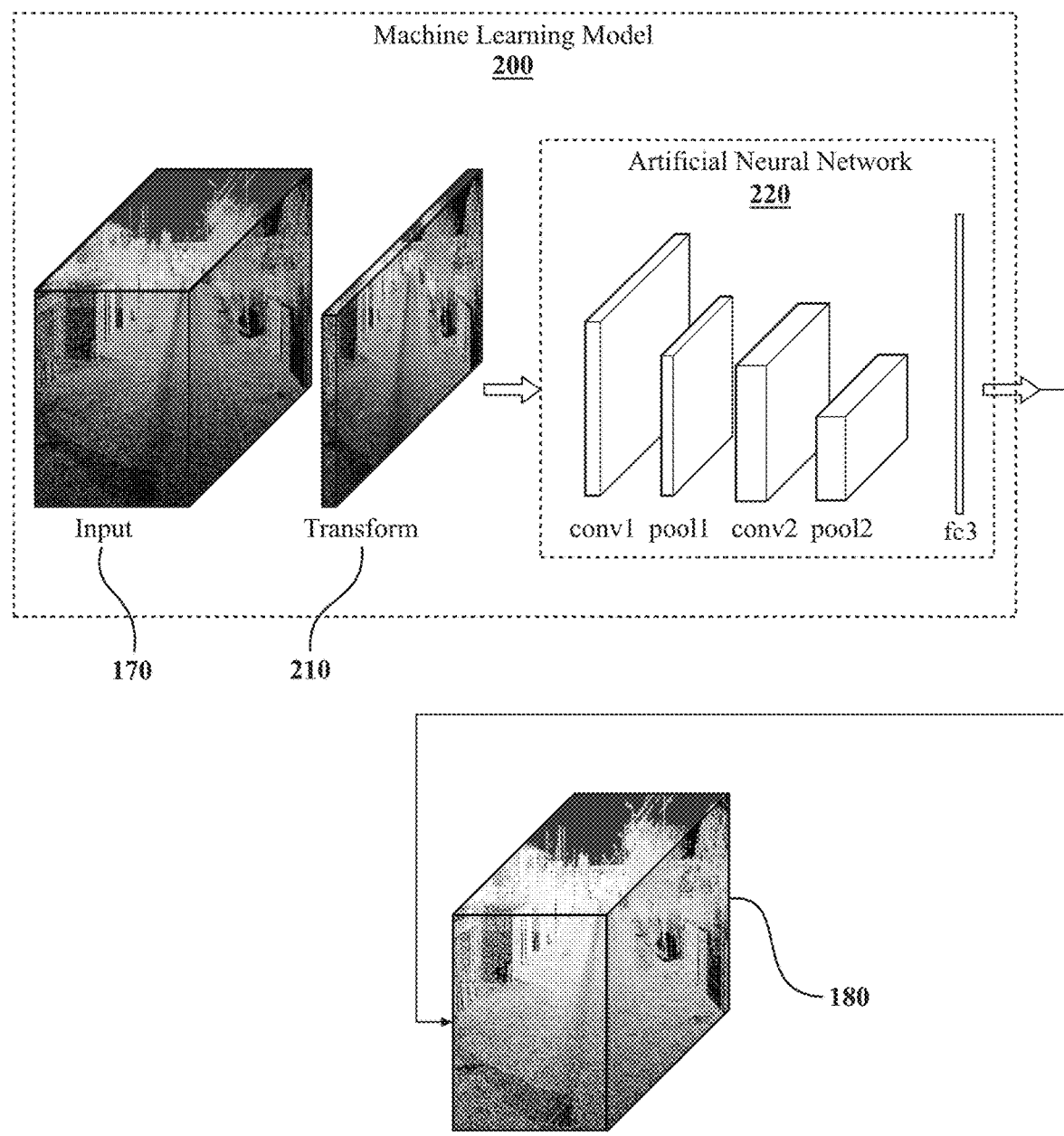
FIG. 2 illustrates one example of an architecture of a machine learning model.

As one example of an implementation of the machine learning model 150, consider FIG. 2, which illustrates a machine learning model 200. The model 200 illustrates the 3D input of sensor data 170 that is passed directly into a transformation 210. The transformation 210, in one embodiment, is a feature encoder network that converts the point cloud representation of the sensor data 170 to a sparse pseudo-image. This transformed version of the sensor data 170 including semantic labels is fed into, for example, an artificial neural network 220. As illustrated, the network 220 is a convolutional neural network (CNN) that includes representative CNN layers including convolutional layers, pooling layers, and a fully connected layer. It should be appreciated that the particular arrangement of layers may vary according to the implementation. Moreover, the particular form of the ANN 220 may also vary to include an RNN, a DNN, and so on.

In still a further implementation, the ANN 220 includes multiple separate networks that, for example, analyze the transformed sensor data 170 from separate perspectives. For example, the ANN 220 may include two separate sub-networks (not illustrated). In one embodiment, the two sub-networks include a top-down network that produces features at varying spatial resolutions and a second network to perform upsampling and concatenation of the features from the top-down network where each block operates at a stride that is relative to the pseudo-image. As a still further aspect, the model 200 can include additional subsequent networks and/or transformations after the ANN 200 that, for example, deconvolve the information back into a 3D format that aligns with the original sensor data 170. Additionally, the post-processing may further provide additional filters and/or other transformations. In this way, the model 150 executes over 3D sensor information to provide a comprehensive analysis of the information when generating the simulated information 180.

With reference to FIG. 1 and the general functionality of the simulation system 100, the input module 130, in one embodiment, generally includes instructions that function to control the processor 110 to receive a request to generate the simulated information 180 associated with the sensor data 170. In one or more approaches, the request takes the form of the sensor data 170 itself and the system 100 receiving the sensor data 170. That is, simply receiving the sensor data 170 functions as the request to generate the information 180.

In a further aspect, the request is a distinct set of data that may be received by the system 100 coincident with the sensor data 170 or separately. The input module 130, in one embodiment, electronically receives the requests. The requests may be generated through an electronic interface with a user, through an automated internal process for generating training data sets, from a simulator or other electronic source that generates requests to train a particular model, and so on. In either case, the request generally induces the system 100 to compute the simulated information 180 and, thus, can include instructions specific to the generation of the simulation information 180. In one embodiment, the request includes additional information to accompany the sensor data 170 such as characteristics of a system that captured the information, and/or other metadata that may influence how the simulation information 180 is computed (e.g., a selection between different available versions of the model 150).

In still further aspects, the request can include instructions about how the simulation information 180 is to be provided (e.g., a particular format) that is, for example, related to a subsequent use of the information 180 such as whether the information 180 is to be included in a simulation, as training data for a particular task, and so on. Generally, the noted additional aspects of the request can serve as the basis for adjusting the processing of the sensor data 170 and/or how the information 180 is ultimately provided. Moreover, the request may further indicate what information is present/absent from the sensor data 170. That is, the request may indicate that the sensor data 170 does not include semantic labels, that the sensor data doesn't include intensity data, and so on. The request may also indicate a particular storage location or other procedural aspects for acquiring the sensor data 170 for processing.

As such, in one embodiment, when the sensor data 170 does not include integrated labels, the input module 130 generates the labels to identify objects represented in the sensor data 170 from the perceived environment. In one embodiment, the labels are semantic labels identifying at least a class (e.g., vehicle, pedestrian, traffic sign) of the object. In further aspects, the labels provide additional characteristics such as surface types (e.g., asphalt, concrete, glass, painted metal, etc.). Thus, the input module 130 may separately implement a deep neural network such as a CNN that designed to perform semantic segmentation or another type of labeling/classification of objects.

With continued reference to FIG. 1, the simulation module 140 includes instructions that when executed by the processor 110 cause the processor 110 to compute the simulated information 180 as a function of the machine learning model 150. As previously described, the machine learning model 150 accepts the sensor data 170 and, in at least one embodiment, labels as an electronic input while generating the simulated information 180 as an electronic output. Thus, the simulation module 140 exploits learned correlations between the sensor data 170 (i.e., range data) and the labels as embodied within the model 150 to infer the simulated information 180. Thus, the learned correlations generally account for material properties of the labeled objects, geometric relationships of the objects with an observation point (e.g., position of the perceiving sensor), object size, shape, and other aspects that influence the intensity of reflected light.

It should be appreciated that the simulation module 140, in various embodiments, is integrated with the model 150. That is, in one or more approaches, the simulation module 140 includes instructions, algorithms, and other aspects related to the model 150 to effectively implement the model 150. Thus, while the model 150 is illustrated as a separate component, in one or more aspects, the simulation module 140 and the model 150 are at least partially integrated together. Moreover, one or more data structures storing hyper parameters and/or other aspects may be further integrated with the simulation module 140.

Additionally, the simulation module 140 provides the simulated information 180 with the sensor data 170 as an output. In one or more embodiments, the simulation module 140 appends or otherwise associates the information 180 with the sensor data 170 as an output. In a further aspect, the simulation module 140 generates an intensity map from the simulation information 180. The simulation module 140 may provide the intensity map as a separate data structure that generally maps intensity values to separate objects and portions of objects in the perceived environment.

Additionally, in various approaches, the simulation system 100 generates a simulation as a computerized environment that is at least partially computer-generated (e.g., the information 180). Thus, the simulation module 140 can integrate the inferred intensity values as perceived sensor values for a computer-generated environment that is based, at least in part, on the original perceived environment. In this way, the simulation system 100 can provide the simulation as a training aid with accurate built-in training data for training one or more machine learning tasks (e.g., autonomous driving tasks associated with machine perception, path planning, obstacle avoidance, etc.).

Continuing with further aspects of the simulation module 140, in one or more embodiments, the simulation module 140 further includes instructions to train the machine learning model 150. In one approach, the simulation module 140 performs a supervised learning process to train model 150 that uses training data. In one embodiment, the training data includes training range data and training intensity data, which are both generally real sensor data acquired from a sensor for which the model 150 is to simulate information. Thus, the system 100, in one or more embodiments, can include separate instances of the model 150 that are separately trained to simulated information for a particular version and/or type of sensor. Further aspects of training the model 150 will be discussed subsequently.

Figure 3:
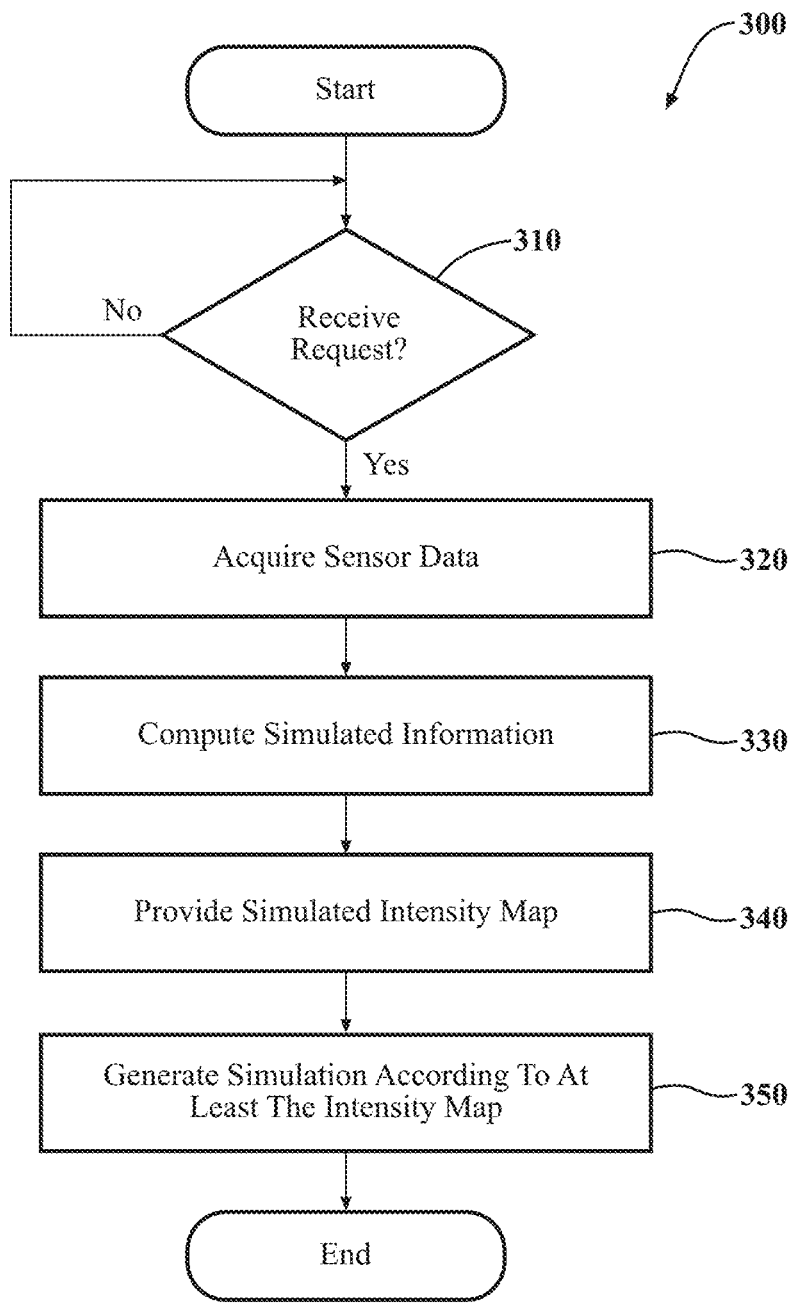
FIG. 3 illustrates a flowchart of one embodiment of a method associated with training a machine learning model.

Additional aspects of inferring secondary attributes of sensor data will be discussed in relation to FIG. 3, which illustrates a flowchart of a method 300. Method 300 will be discussed from the perspective of the simulation system 100 of FIG. 1. While method 300 is discussed in combination with the simulation system 100, it should be understood that the method 300 is not limited to being implemented within the simulation system 100 but is instead one example of a system that may implement the method 300.

At 310, the input module 130 monitors for a request to compute the simulated information 180. As noted previously, in one or more embodiments, the input module 130 may receive an explicit request to generate simulated information 180 or an embedded request that corresponds to receiving the sensor data 170 itself. Moreover, in one embodiment, the request is for a single set of the sensor data 170 (e.g., a single scene), whereas, in further embodiments, the request may specify a plurality of scenes corresponding with distinct sets of sensor data 170. In either case, the request includes a description of at least the sensor data 170. In one approach, the description includes a selection of additional features that may be included as part of the subsequent simulation and/or of particular characteristics of the sensor data 170. In either case, the request generally induces the input module 130 to acquire the sensor data 170 as discussed at 320.

At 320, the input module 130 acquires the sensor data 170 that includes at least range information about a perceived environment. The input module 130 may undertake different processes to acquire the sensor data 170 but generally acquires the sensor data 170 from a data store such as a cloud-based repository. Of course, in further embodiments, the input module 130 may acquire the sensor data 170 via a direct communication link with a sensor, from a local database, or through another suitable mechanism. In either case, as a general feature of the sensor data 170, the sensor data 170 is comprised of range information that can be in a three-dimensional format such as a 3D point cloud of LiDAR returns that are generally missing one or more attributes such as intensity data, which may be the result of a sensor that does not collect the noted information, a process potentially stripping the information, etc.

As a further aspect and also as previously explained, the input module 130, in one or more embodiments, acquires the sensor data 170, at 320, including the labels for objects represented in the sensor data 170. This process may take different forms and can include directly generating the labels and/or acquiring the labels from another source (e.g., as part of the data, from a third party labeling source, etc.). In either case, the sensor data 170 is to, in at least one embodiment, include the semantic labels prior to being input to the model 150.

At 330, the simulation module 140 computes simulated information 180. In one or more approaches, the simulation module 140 selects a particular instance of the model 150 that, for example, aligns with particular aspects of the sensor data 170 (e.g., a particular type/version of a sensor). In either case, the simulation module 140 computes the simulation information 180 using the model 150. Thus, the process of computing the simulation information 180 involves using learned correlations embodied within the model 150 as opposed to heuristics or physics models that perform ray tracing and other complex and inefficient analysis of an environment to estimate the missing attributes. Instead, the model 150 accounts for particular aspects of the objects such as reflectivities, geometric relationships, material properties, and other aspects that are intrinsically embodied within the learned correlations developed according to the training process as explained further subsequently. In either case, the simulation module 140 provides for inferring the intensity data from inputs including range information and semantic labels.

At 340, the simulation module 140 provides the simulated information with the sensor data 170. In one embodiment, providing the simulation information 180 includes, for example, generating an intensity map for the perceived environment that correlates the simulated information 180 with the sensor data 170 and the objects in the perceived environment. In general, the intensity map is an electronic data structure that includes the simulated information 180, and mappings to the sensor data 170. In one approach, the intensity map correlates with the sensor data 170 via assigned coordinates. In a further aspect, the simulated information is embedded with the sensor data 170. Whichever approach is undertaken, the simulation information 180 is linked to the sensor data 170 to provide a clear correlation between the two attributes.

At 350, the simulation module 140 generates a simulation. In one embodiment, the simulation module 140 generates the simulation according to at least the simulation information 180. For example, in one approach, the simulation module 140 populates a computer-reconstructed version of the perceived environment that correlates with the sensor data 170 using at least the sensor data 170 and the simulation information 180. Thus, the system 100 can use the simulation to, for example, train a task-specific module by emulating sensor data from a sensor (e.g., LiDAR) using the combined data 170 and 180. For example, the system 100 can feed the data 170 and 180 into the module as though a vehicle was proceeding through the perceived environment. As such, the system 100 effectively simulates information that would be provided to the module under actual operating conditions and can thereby train the module to perceive aspects of the environment. The inclusion of the simulation information 180 ensures that the perceptions provided to the module are comprehensive thereby improving the training of the module even though the actual corresponding secondary attributes may be unavailable for the sensor data 170.

In a further aspect, the simulation module 140 provides the combined sensor data as an electronic output. In one embodiment, the sensor data/intensity map is stored in a memory (e.g., memory 120, data store 160, or another electronic data store). The sensor data/intensity map may be electronically stored until an associated data set is complete from further computation by the simulation system 100 of additional sensor data. Once the simulation system 100 produces the sensor data 170 including the simulated information 180, the simulation system 100 can produce the simulation to train a module for which the simulated information was generated. Accordingly, in one embodiment, the simulation system 100 generates the training set and stores the training set until needed, which, in one embodiment, is in support of a simulation to depict sensor data for particular selected subject matter that relates to training a module on a specific task (e.g., obstacle detection, collision avoidance, etc.). In this way, the simulation system 100 functions to improve the creation of sensor data for training and thereby improve the training of associated modules and the overall functioning of autonomous vehicle systems that use the trained modules.

Figure 4:
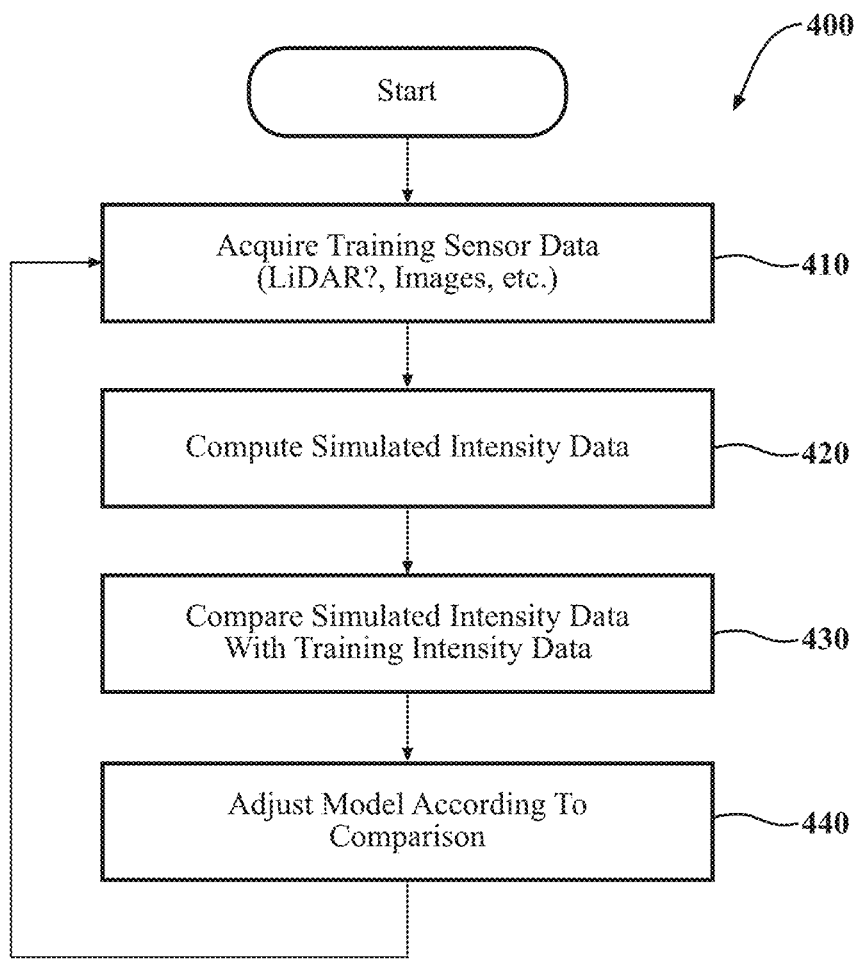
FIG. 4 illustrates a flowchart of one embodiment of a method associated with simulating sensor data.

Aspects relating to training a machine learning model to infer secondary attributes of sensor data will be discussed in relation to FIG. 4, which illustrates a flowchart of a method 400. Method 400 will be discussed from the perspective of the simulation system 100 of FIG. 1. While method 400 is discussed in combination with the simulation system 100, it should be understood that the method 400 is not limited to being implemented within the simulation system 100 but is instead one example of a system that may implement the method 400.

At 410, the simulation system 100 acquires a set of training sensor data. In one embodiment, the training sensor data is a set of real sensor data that include labels of object instances depicted therein and also includes both primary (e.g., range data) and secondary attributes (e.g., intensity data). If not initially labeled, the simulation system 100 may apply an object recognition algorithm to the training data set to produce the labels, which are generally semantic labels. Moreover, the real sensor data (i.e., produced by a sensor as opposed to being simulated) generally depicts a set of scenes that is related to an overall focus of the simulation system 100. Thus, the real sensor data may depict driving scenes (e.g., roadways with vehicles, pedestrians, and other transportation-related aspects) if directed to providing data for driving-related activities. In one approach, the real sensor data depicts a various assortment of object instances for different classes and of different characteristics within each class in order to provide a comprehensive data sampling for training.

In general, the simulation system 100 acquires the training sensor data from a source such as a real sensor (e.g., LiDAR) that is affixed to a vehicle and that stores data including the primary and secondary attributes. In one or more approaches, the training data may be crowd-sourced from vehicles having the particular sensor such as fleet vehicles and/or personal vehicles that opt-in to providing such data. In still a further aspect, a mapping/surveying vehicle may collect the training data and provide the training data for use by systems such as the simulation system 100.

At 420, the simulation module 140 computes simulated intensity data. In general, the simulation module 140 executes the model 150 over the training sensor data in a similar manner as discussed in relation to block 330 of FIG. 3. Thus, for purposes of brevity in this description, the explanation will not be repeated. However, it should be understood that the simulation module 140 functions to provide the primary attributes and the labels while withholding the secondary attributes (i.e., intensity data). Thus, the simulation system 100 uses the training intensity data, which is part of the training sensor data, as a point of comparison for training as opposed to an input into the actual model 150.

At 430, the simulation module 140 compares the training intensity data with the simulated intensity data produced by the machine learning model 150 to determine a loss. In one embodiment, the simulation module 140 uses a loss function to quantize a difference between the two values, which may assess a difference therebetween in a simplistic fashion (e.g., a simple difference of values) or in a more complex fashion (e.g., weighted difference of surrounding points) depending on a particular implementation. In either case, the loss indicates how accurately the model 150 is inferring the information 180.

At 440, the simulation module 140 adjusts parameters of the machine learning model 150 according to the loss. That is, the simulation module 140 backpropagates the loss into internal nodal weights (e.g., hyper parameters) of the model 150 to adjust how the model 150 processes the inputs. In this way, the model 150 intrinsically learns the correlations between the inputs and the outputs so that subsequent iterations of the model 150 provide improved outputs. In general, the method 400 is executed iteratively over a large training set to provide sufficiently accurate results for inferring the intensity data.

Figure 5:
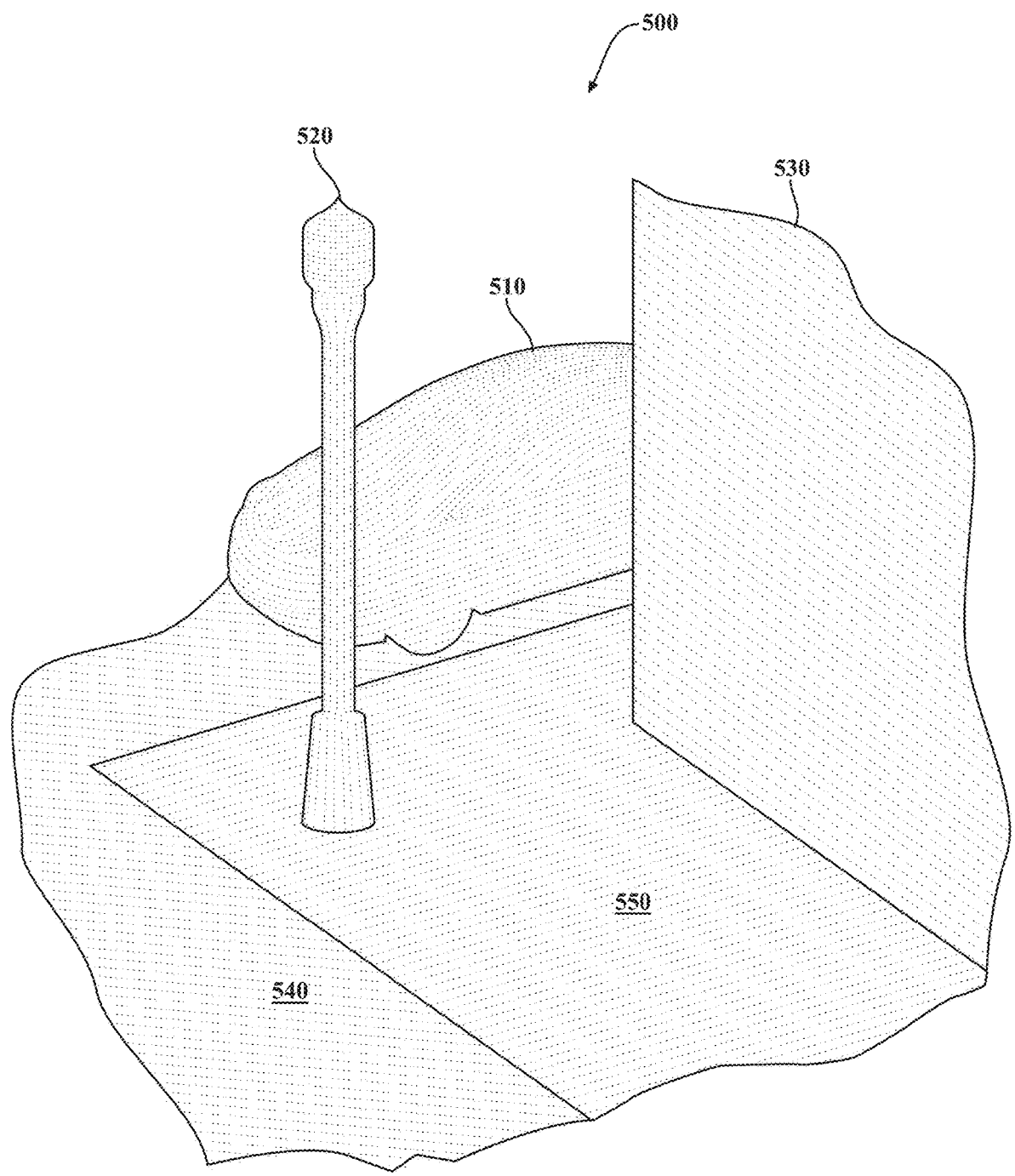
FIG. 5 illustrates an example scene of perceived sensor data.

As an additional explanation of how the simulation system 100 functions, one example of a point cloud 500 is provided as an example in FIG. 5. The point cloud 500 represents sensor data 170 along with labels for a particular scene. As shown in FIG. 5, the scene depicts a vehicle 510, a light post 520, a building 530, a road 540, and a sidewalk 550. The noted elements are viewed from an observation point of a sensor (e.g., LiDAR) and are represented by points that are enclosed with outlines. The points represent range data for corresponding points on the surfaces of the objects while the outlines represent defined bounds of the objects as estimated from generated labels. Thus, as shown, the scene 500 embodied by the sensor data includes a partial representation of the scene since intensity data is not included.

Accordingly, in one embodiment, the simulation system 100 acquires the sensor data and the labels as shown in the scene 500 and processes the data using the model 150. The output of this process is an intensity map identifying expected return values of reflected light from the various surfaces depicted in the scene 500. Thus, by way of example, various reflective surfaces such as the vehicle 510 and the light post 520 may have higher intensity values (depending on orientation and distance) due to properties of the associated materials (e.g., metal and glass) as opposed to surfaces such as the road 540, the sidewalk 550, and the building 530, which generally have lower abilities to reflect light because of properties of the respective surfaces. Therefore, the model 150 infers these values through learned correlations to provide partially simulated and improved sensor data.

Figure 6:
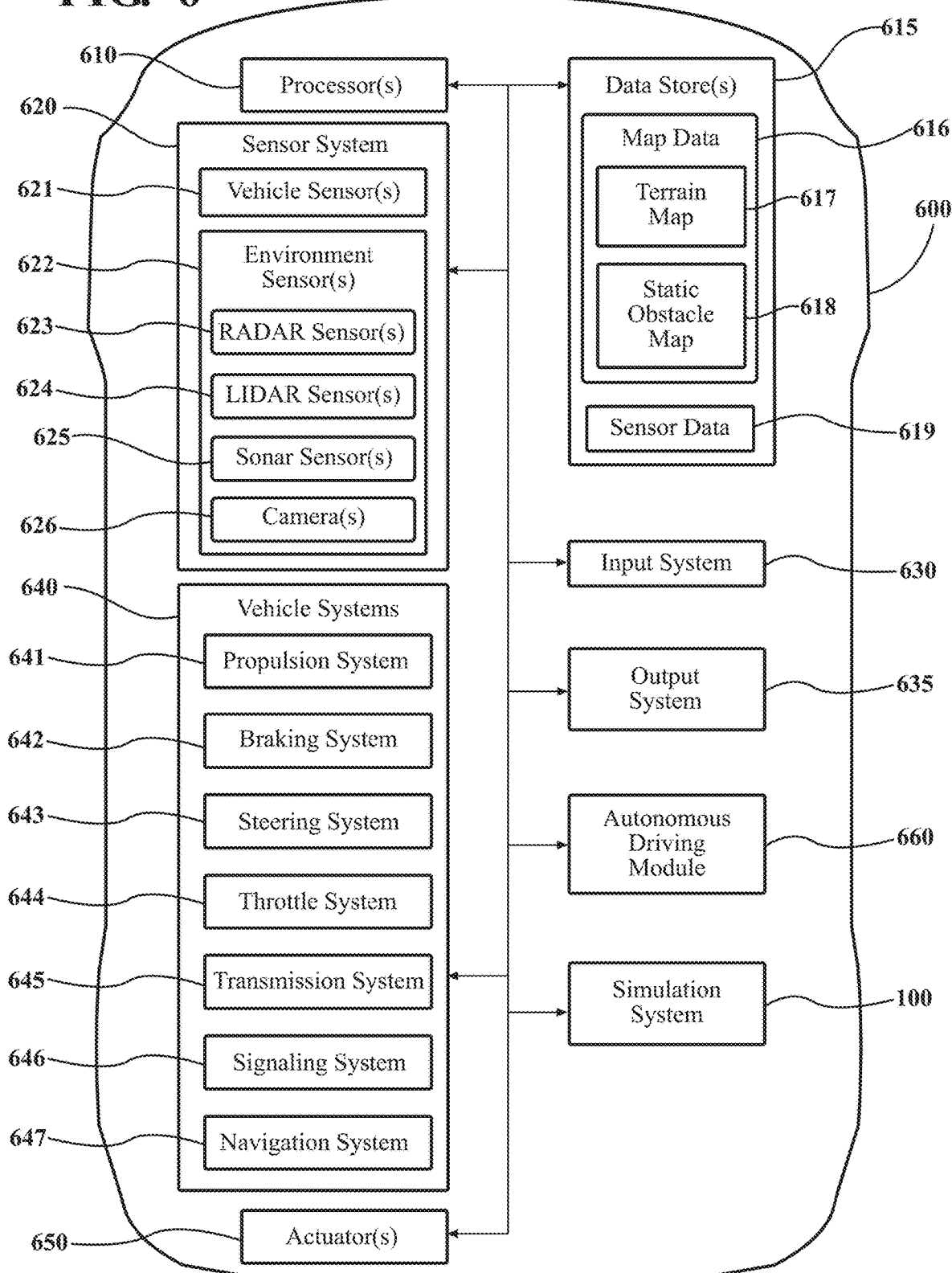
FIG. 6 illustrates one embodiment of a vehicle within which systems and methods disclosed herein may be implemented.

As an additional example of an implementation of at least a portion of the simulation system 100, an example vehicle 600 will now be discussed in relation to FIG. 6. FIG. 6 represents an example environment within which the system and methods disclosed herein may operate or at least within which training data from the simulated sensor data may be used to train various modules. It should be appreciated that the system 100 could also be implemented as a cloud-based system. In some instances, the vehicle 600 is configured to switch selectively between an autonomous mode, one or more semi-autonomous operational modes, and/or a manual mode. Such switching can be implemented in a suitable manner, now known or later developed. "Manual mode" means that all of or a majority of the navigation and/or maneuvering of the vehicle is performed according to inputs received from a user (e.g., human driver). In one or more arrangements, the vehicle 600 can be a conventional vehicle that is configured to operate in only a manual mode.

In one or more embodiments, the vehicle 600 is an autonomous vehicle. As used herein, "autonomous vehicle" refers to a vehicle that operates in an autonomous mode to self-drive without control inputs from a human driver. "Autonomous mode" refers to navigating and/or maneuvering the vehicle 600 along a travel route using one or more computing systems to control the vehicle 600 with minimal or no input from a human driver. In one or more embodiments, the vehicle 600 is highly automated or completely automated. In one embodiment, the vehicle 600 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 600 along a travel route.

The vehicle 600 can include one or more processors 610. In one or more arrangements, the processor(s) 610 can be a main processor of the vehicle 600. For instance, the processor(s) 610 can be an electronic control unit (ECU). The vehicle 600 can include one or more data stores 615 for storing one or more types of data. The data stores 615 can include volatile and/or non-volatile memory. Examples of suitable data stores 615 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 615 can be a component of the processor(s) 610, or the data store 615 can be operatively connected to the processor(s) 610 for use thereby. The term "operatively connected," as used throughout this description, can include direct or indirect connections, including connections without direct physical contact.

In one or more arrangements, the one or more data stores 615 can include map data 616. The map data 616 can include maps of one or more geographic areas. In some instances, the map data 616 can include information or data on roads, traffic control devices, road markings, structures, features, and/or landmarks in the one or more geographic areas. The map data 616 can be in any suitable form. In some instances, the map data 616 can include aerial views of an area. In some instances, the map data 616 can include ground views of an area, including 360-degree ground views. The map data 616 can include measurements, dimensions, distances, and/or information for one or more items included in the map data 616 and/or relative to other items included in the map data 616. The map data 616 can include a digital map with information about road geometry. The map data 616 can be high quality and/or highly detailed.

In one or more arrangements, the map data 616 can include one or more terrain maps 617. The terrain maps 617 can include information about the ground, terrain, roads, surfaces, and/or other features of one or more geographic areas. The terrain maps 617 can include elevation data in the one or more geographic areas. The map data 616 can be high quality and/or highly detailed. The terrain maps 617 can define one or more ground surfaces, which can include paved roads, unpaved roads, land, and other things that define a ground surface.

In one or more arrangements, the map data 616 can include one or more static obstacle maps 618. The static obstacle map(s) 618 can include information about one or more static obstacles located within one or more geographic areas. A "static obstacle" is a physical object whose position does not change or substantially change over a period of time and/or whose size does not change or substantially change over a period of time. Examples of static obstacles include trees, buildings, curbs, fences, railings, medians, utility poles, statues, monuments, signs, benches, furniture, mailboxes, large rocks, hills. The static obstacles can be objects that extend above ground level. The one or more static obstacles included in the static obstacle map(s) 618 can have location data, size data, dimension data, material data, and/or other data associated with it. The static obstacle map(s) 618 can include measurements, dimensions, distances, and/or information for one or more static obstacles. The static obstacle map(s) 618 can be high quality and/or highly detailed. The static obstacle map(s) 618 can be updated to reflect changes within a mapped area.

The one or more data stores 615 can include sensor data 619. In this context, "sensor data" means any information about the sensors that the vehicle 600 is equipped with, including the capabilities and other information about such sensors. As will be explained below, the vehicle 600 can include the sensor system 620. The sensor data 619 can relate to one or more sensors of the sensor system 620. As an example, in one or more arrangements, the sensor data 619 can include information on one or more LIDAR sensors 624 of the sensor system 620.

In some instances, at least a portion of the map data 616 and/or the sensor data 619 can be located in one or more data stores 615 located onboard the vehicle 600. Alternatively, or in addition, at least a portion of the map data 616 and/or the sensor data 619 can be located in one or more data stores 615 that are located remotely from the vehicle 600.

As noted above, the vehicle 600 can include the sensor system 620. The sensor system 620 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 620 includes a plurality of sensors, the sensors can work independently from each other. Alternatively, two or more of the sensors can work in combination with each other. In such a case, the two or more sensors can form a sensor network. The sensor system 620 and/or the one or more sensors can be operatively connected to the processor(s) 610, the data store(s) 615, and/or another element of the vehicle 600 (including any of the elements shown in FIG. 6). The sensor system 620 can acquire data of at least a portion of the external environment of the vehicle 600.

The sensor system 620 can include any suitable type of sensor. Various examples of different types of sensors will be described herein. However, it will be understood that the embodiments are not limited to the particular sensors described. The sensor system 620 can include one or more vehicle sensors 621. The vehicle sensors 621 can detect, determine, and/or sense information about the vehicle 600 itself. In one or more arrangements, the vehicle sensors 621 can be configured to detect, and/or sense position and orientation changes of the vehicle 600, such as, for example, based on inertial acceleration. In one or more arrangements, the vehicle sensors 621 can include one or more accelerometers, one or more gyroscopes, an inertial measurement unit (IMU), a dead-reckoning system, a global navigation satellite system (GNSS), a global positioning system (GPS), a navigation system 647, and/or other suitable sensors. The vehicle sensors 621 can be configured to detect, and/or sense one or more characteristics of the vehicle 600. In one or more arrangements, the vehicle sensors 621 can include a speedometer to determine a current speed of the vehicle 600.

Alternatively, or in addition, the sensor system 620 can include one or more environment sensors 622 configured to acquire, and/or sense driving environment data. "Driving environment data" includes data or information about the external environment in which an autonomous vehicle is located or one or more portions thereof. For example, the one or more environment sensors 622 can be configured to detect, quantify and/or sense obstacles in at least a portion of the external environment of the vehicle 600 and/or information/data about such obstacles. Such obstacles may be stationary objects and/or dynamic objects. The one or more environment sensors 622 can be configured to detect, measure, quantify and/or sense other things in the external environment of the vehicle 600, such as, for example, lane markers, signs, traffic lights, traffic signs, lane lines, crosswalks, curbs proximate the vehicle 600, off-road objects, etc.

Various examples of sensors of the sensor system 620 will be described herein. The example sensors may be part of the one or more environment sensors 622 and/or the one or more vehicle sensors 621. However, it will be understood that the embodiments are not limited to the particular sensors described. As an example, in one or more arrangements, the sensor system 620 can include one or more radar sensors 623, one or more LIDAR sensors 624, one or more sonar sensors 625, and/or one or more cameras 626. In one or more arrangements, the one or more cameras 626 can be high dynamic range (HDR) cameras or infrared (IR) cameras.

The vehicle 600 can include an input system 630. An "input system" includes any device, component, system, element or arrangement or groups thereof that enable information/data to be entered into a machine. The input system 630 can receive an input from a vehicle passenger (e.g., a driver or a passenger). The vehicle 600 can include an output system 635. An "output system" includes any device, component, or arrangement or groups thereof that enable information/data to be presented to a vehicle passenger (e.g., a person, a vehicle passenger, etc.).

The vehicle 600 can include one or more vehicle systems 640. Various examples of the one or more vehicle systems 640 are shown in FIG. 6. However, the vehicle 600 can include more, fewer, or different vehicle systems. It should be appreciated that although particular vehicle systems are separately defined, each or any of the systems or portions thereof may be otherwise combined or segregated via hardware and/or software within the vehicle 600. The vehicle 600 can include a propulsion system 641, a braking system 642, a steering system 643, throttle system 644, a transmission system 645, a signaling system 646, and/or a navigation system 647. Each of these systems can include one or more devices, components, and/or combination thereof, now known or later developed.

The navigation system 647 can include one or more devices, applications, and/or combinations thereof, now known or later developed, configured to determine the geographic location of the vehicle 600 and/or to determine a travel route for the vehicle 600. The navigation system 647 can include one or more mapping applications to determine a travel route for the vehicle 600. The navigation system 647 can include a global positioning system, a local positioning system or a geolocation system.

The processor(s) 610 (and/or processor 110), the simulation system 100, and/or the autonomous driving module(s) 660 can be operatively connected to communicate with the various vehicle systems 640 and/or individual components thereof. For example, returning to FIG. 6, the processor(s) 610 and/or the autonomous driving module(s) 660 can be in communication to send and/or receive information from the various vehicle systems 640 to control the movement, speed, maneuvering, heading, direction, etc. of the vehicle 600. The processor(s) 110, the simulation system 100, and/or the autonomous driving module(s) 660 may control some or all of these vehicle systems 640 and, thus, may be partially or fully autonomous.

The processor(s) 110, the simulation system 100, and/or the autonomous driving module(s) 660 can be operatively connected to communicate with the various vehicle systems 640 and/or individual components thereof. For example, returning to FIG. 6, the processor(s) 610, the simulation system 100, and/or the autonomous driving module(s) 660 can be in communication to send and/or receive information from the various vehicle systems 640 to control the movement, speed, maneuvering, heading, direction, etc. of the vehicle 600. The processor(s) 110, the simulation system 100, and/or the autonomous driving module(s) 660 may control some or all of these vehicle systems 640. For example, the processor 610, in one embodiment, controls the camera 626 to acquire images of an area surrounding the vehicle, which are then provided to the simulation system 100 to extract content about the environment so that the autonomous driving module 660 can make determinations about how to control the vehicle 600.

The processor(s) 610, the simulation system 100, and/or the autonomous driving module(s) 660 may be operable to control the navigation and/or maneuvering of the vehicle 600 by controlling one or more of the vehicle systems 640 and/or components thereof. For instance, when operating in an autonomous mode, the processor(s) 610, the simulation system 100, and/or the autonomous driving module(s) 660 can control the direction and/or speed of the vehicle 600. The processor(s) 610, the simulation system 100, and/or the autonomous driving module(s) 660 can cause the vehicle 600 to accelerate (e.g., by increasing the supply of fuel provided to the engine), decelerate (e.g., by decreasing the supply of fuel to the engine and/or by applying brakes) and/or change direction (e.g., by turning the front two wheels). However, as generally applied herein, the simulation system 100 functions in cooperation with the autonomous driving module 660 to train one or more machine learning algorithms therein. That is, the simulation system 100 can generate training simulations for the module 660 related to particular tasks (e.g., object detection/classification, etc.) using the simulated information 180, which may supplement real sensor data gathered by the sensor system 620 of the vehicle 600. In either case, the simulation system 100 functions to support training of the module 660 in order to improve autonomous and/or semi-autonomous operation thereof.

The vehicle 600 can include one or more actuators 650. The actuators 650 can be any element or combination of elements operable to modify, adjust and/or alter one or more of the vehicle systems 640 or components thereof to responsive to receiving signals or other inputs from the processor(s) 610 and/or the autonomous driving module(s) 660. Any suitable actuator can be used. For instance, the one or more actuators 650 can include motors, pneumatic actuators, hydraulic pistons, relays, solenoids, and/or piezoelectric actuators, just to name a few possibilities.

The vehicle 600 can include one or more modules, at least some of which are described herein. The modules can be implemented as computer-readable program code that, when executed by a processor 610, implement one or more of the various processes described herein. One or more of the modules can be a component of the processor(s) 610, or one or more of the modules can be executed on and/or distributed among other processing systems to which the processor(s) 610 is operatively connected. The modules can include instructions (e.g., program logic) executable by one or more processor(s) 610. Alternatively, or in addition, one or more data store 615 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

The vehicle 600 can include one or more autonomous driving modules 660. The autonomous driving module(s) 660 can be configured to receive data from the sensor system 620, the simulation system 100, and/or any other type of system capable of capturing information relating to the vehicle 600 and/or the external environment of the vehicle 600 and/or related to simulating environments for training. In one or more arrangements, the autonomous driving module(s) 660 can use such data to generate one or more driving scene models. The autonomous driving module(s) 660 can determine position and velocity of the vehicle 600. The autonomous driving module(s) 660 can determine the location of obstacles, objects, or other environmental features including traffic signs, trees, shrubs, neighboring vehicles, pedestrians, etc.

The autonomous driving module(s) 660 can be configured to receive, and/or determine location information for obstacles within the external environment of the vehicle 600 for use by the processor(s) 610, and/or one or more of the modules 660 described herein to estimate position and orientation of the vehicle 600, vehicle position in global coordinates based on signals from a plurality of satellites, or any other data and/or signals that could be used to determine the current state of the vehicle 600 or determine the position of the vehicle 600 with respect to its environment for use in either creating a map or determining the position of the vehicle 600 in respect to map data.

The autonomous driving modules 660 either independently or in combination can be configured to determine travel path(s), current autonomous driving maneuvers for the vehicle 600, future autonomous driving maneuvers and/or modifications to current autonomous driving maneuvers based on data acquired by the sensor system 620 (or the simulation system 100), driving scene models, and/or data from any other suitable source. "Driving maneuver" means one or more actions that affect the movement of a vehicle. Examples of driving maneuvers include: accelerating, decelerating, braking, turning, moving in a lateral direction of the vehicle 600, changing travel lanes, merging into a travel lane, and/or reversing, just to name a few possibilities. The autonomous driving module(s) 660 can be configured to implement determined driving maneuvers. The autonomous driving module(s) 660 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 660 can be configured to execute various vehicle functions and/or to transmit data to, receive data from, interact with, and/or control the vehicle 600 or one or more systems thereof (e.g., one or more of vehicle systems 640).

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-6, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A simulation system for simulating aspects of sensor data, comprising:
one or more processors;
a memory communicably coupled to the one or more processors and storing:
an input module including instructions that when executed by the one or more processors cause the one or more processors to, in response to receiving a request to generate simulated information associated with the sensor data, acquire the sensor data from at least one sensor that includes at least range information about a perceived environment observed by the at least one sensor, and to generate semantic labels for objects in the perceived environment that are depicted by the sensor data, wherein the request for the simulated information specifies one or more attributes of the sensor data that are absent from the sensor data in a current format; and
a simulation module including instructions that when executed by the one or more processors cause the one or more processors to:
compute the simulated information associated with the sensor data using a machine learning model that accepts the sensor data and the semantic labels as an input and processes the input, including the semantic labels, to produce the simulated information as an output that completes the sensor data, and
provide the simulated information with the sensor data, wherein the simulation module includes instructions to:
train the machine learning model using training data that includes training range data and training intensity data by comparing the training intensity data with the simulated information that includes inferred intensity data produced by the machine learning model to determine a loss.

2. The simulation system of claim 1, wherein the sensor data is range information associated with the perceived environment from one of: an image from an image sensor and a point cloud from a light detection and ranging (LiDAR) sensor,
wherein the simulated information is intensity data that indicates intensities of reflected light from observed points within the perceived environment, and
wherein the intensities correspond with one or more attributes of the objects.

3. The simulation system of claim 1,
wherein the simulation module includes instructions to compute the simulated information including instructions to compute the simulated information according to learned correlations between the range information and the semantic labels that account for material properties of the objects and geometric relationships of the objects with an observation point to infer the simulated information.

4. The simulation system of claim 1, wherein the machine learning model is an artificial neural network including at least one of: a convolutional neural network (CNN), a recurrent neural network (RNN), a deep neural network (DNN), one or more pre-processing transformations, and one or more post-processing transformations, and
wherein the simulation module includes instructions to compute the simulated information using the machine learning model including using learned correlations embodied within the machine learning model to infer the simulated information.

5. The simulation system of claim 1, wherein the simulation module includes instructions to provide the simulated information including instructions to generate an intensity map for the perceived environment that correlates the simulated information with the sensor data and the objects in the perceived environment, and generating a simulation associated with the perceived environment according to the intensity map and the sensor data, and
wherein the simulation is at least partially computer-generated and provides training data for training one or more machine learning tasks.

6. The simulation system of claim 1, wherein the input module includes instructions to acquire the sensor data including instructions to generate the semantic labels for objects represented in the sensor data using a semantic segmentation model.

7. The simulation system of claim 1, wherein the machine learning model includes a top-down network that produces features at varying spatial resolutions and a second network that upsamples and concatenates the features from the top-down network back into a three-dimensional format that aligns with the sensor data.

8. The simulation system of claim 7, wherein the simulation module includes instructions to train including instructions to iteratively adjust parameters of the machine learning model according to the loss.

9. A non-transitory computer-readable medium for simulating aspects of sensor data and including instructions that when executed by one or more processors cause the one or more processors to:
in response to receiving a request to generate simulated information associated with the sensor data, acquire the sensor data from at least one sensor that includes at least range information about a perceived environment observed by the at least one sensor, and to generate semantic labels for objects in the perceived environment that are depicted by the sensor data, wherein the request for the simulated information specifies one or more attributes of the sensor data that are absent from the sensor data in a current format;
compute the simulated information associated with the sensor data using a machine learning model that accepts the sensor data and the semantic labels as an input and processes the input, including the semantic labels, to produce the simulated information as an output that completes the sensor data;
provide the simulated information with the sensor data; and
train the machine learning model using training data that includes training range data and training intensity data by comparing the training intensity data with the simulated information that includes inferred intensity data produced by the machine learning model to determine a loss.

10. The non-transitory computer-readable medium of claim 9, wherein the sensor data is range information associated with the perceived environment from one of: an image from an image sensor and a point cloud from a light detection and ranging (LiDAR) sensor,
wherein the simulated information is intensity data that indicates intensities of reflected light from observed points within the perceived environment, and
wherein the intensities correspond with one or more attributes of the objects.

11. The non-transitory computer-readable medium of claim 9,
wherein the instructions to compute the simulated information include instructions to compute the simulated information according to learned correlations between the range information and the semantic labels that account for material properties of the objects and geometric relationships of the objects with an observation point to infer the simulated information.

12. The non-transitory computer-readable medium of claim 9, wherein the machine learning model is an artificial neural network including at least one of: a convolutional neural network (CNN), a recurrent neural network (RNN), a deep neural network (DNN), one or more pre-processing transformations, and one or more post-processing transformations, and
wherein the instructions to compute the simulated information using the machine learning model include instructions to use learned correlations embodied within the machine learning model to infer the simulated information.

13. The non-transitory computer-readable medium of claim 9, wherein the instructions to provide the simulated information include instructions to generate an intensity map for the perceived environment that correlates the simulated information with the sensor data and the objects in the perceived environment, and generating a simulation associated with the perceived environment according to the intensity map and the sensor data, and
wherein the simulation is at least partially computer-generated and provides training data for training one or more machine learning tasks.

14. A method of simulating aspects of sensor data, comprising:
in response to receiving a request to generate simulated information, acquiring the sensor data from at least one sensor that includes at least range information about a perceived environment observed by the at least one sensor and to generate semantic labels for objects in the perceived environment that are depicted by the sensor data, wherein the request for the simulated information specifies one or more attributes of the sensor data that are absent from the sensor data in a current format;
computing the simulated information associated with the sensor data using a machine learning model that accepts the sensor data and the semantic labels as an input and processes the input, including the semantic labels, to produce the simulated information as an output that completes the sensor data; and providing the simulated information with the sensor data; and training the machine learning model using training data that includes training range data and training intensity data by comparing the training intensity data with the simulated information that includes inferred intensity data produced by the machine learning model to determine a loss.

15. The method of claim 14, wherein the sensor data is range information associated with the perceived environment from one of: an image from an image sensor and a point cloud from a light detection and ranging (LiDAR) sensor, wherein the simulated information is intensity data that indicates intensities of reflected light from observed points within the perceived environment, and wherein the intensities correspond with one or more attributes of the objects.

16. The method of claim 14, wherein computing the simulated information includes computing the simulated information according to learned correlations between the range information and the semantic labels that account for material properties of the objects and geometric relationships of the objects with an observation point to infer the simulated information.

17. The method of claim 14, wherein the machine learning model is an artificial neural network including at least one of: a convolutional neural network (CNN), a recurrent neural network (RNN), a deep neural network (DNN), one or more pre-processing transformations, and one or more post-processing transformations, and wherein computing the simulated information using the machine learning model includes using learned correlations embodied within the machine learning model to infer the simulated information.

18. The method of claim 14, wherein providing the simulated information includes generating an intensity map for the perceived environment that correlates the simulated information with the sensor data and the objects in the perceived environment, and generating a simulation associated with the perceived environment according to the intensity map and the sensor data, and wherein the simulation is at least partially computer-generated and provides training data for training one or more machine learning tasks.

19. The method of claim 14, wherein the machine learning model includes a top-down network that produces features at varying spatial resolutions and a second network that upsamples and concatenates the features from the top-down network back into a three-dimensional format that aligns with the sensor data.

20. The method of claim 19, wherein training includes iteratively adjusting parameters of the machine learning model according to the loss.

* * * * *